United States Patent [19]
Toda
[11] 4,296,348
[45] * Oct. 20, 1981

[54] INTERDIGITATED ELECTRODE ULTRASONIC TRANSDUCER

[75] Inventor: Kohji Toda, Yokosuka, Japan

[73] Assignee: TDK Electronics Co., Ltd., Tokyo, Japan; a part interest

[ * ] Notice: The portion of the term of this patent subsequent to Oct. 30, 1996, has been disclaimed.

[21] Appl. No.: 68,273

[22] Filed: Aug. 20, 1979

[30] Foreign Application Priority Data

Aug. 21, 1978 [JP] Japan ................................ 53/100929

[51] Int. Cl.³ ............................................ H01L 41/08

[52] U.S. Cl. .................................... 310/334; 310/337; 310/313 B; 367/164

[58] Field of Search ........................ 310/313, 334, 337; 128/660, 24 A; 333/187, 191, 141, 142, 149; 73/596, 598, 602, 603, 605–607, 610, 618, 625–629, 632, 633, 642; 367/138, 141, 153–155, 157, 164

[56] References Cited

U.S. PATENT DOCUMENTS

| | | | |
|---|---|---|---|
| 2,875,355 | 2/1959 | Petermann | 310/334 |
| 3,086,195 | 4/1963 | Halliday | 310/334 X |
| 3,166,731 | 1/1965 | Joy | 310/334 X |
| 3,401,360 | 9/1968 | Bois | 310/334 X |
| 3,745,812 | 7/1973 | Korpel | 310/334 X |
| 3,962,673 | 6/1976 | Desbois | 310/334 X |
| 4,075,516 | 2/1978 | Hattori | 310/334 |
| 4,173,009 | 10/1979 | Toda | 310/334 X |

OTHER PUBLICATIONS

Surface Elastic Waves, by Richard M. White, *Proceedings of IEEE*, vol. 58, No. 8, Aug. 1970, pp. 1238–1275.

*Primary Examiner*—Mark O. Budd
*Attorney, Agent, or Firm*—Allison C. Collard; Thomas M. Galgano

[57] ABSTRACT

An ultrasonic transducer including a thin piezo-electric substrate and an interdigital electrode radiating ultrasonic wave beams with excellent focusing characteristics into a liquid medium in contact with the substrate by applying AC voltages to the electrode.

6 Claims, 5 Drawing Figures

INTERDIGITATED ELECTRODE ULTRASONIC TRANSDUCER

BACKGROUND OF THE INVENTION

1. Field of the Invention

This invention relates to a transducer for generating ultrasonic waves to be used in an ultrasonic device, and more particularly to a transducer for generating ultrasonic waves in a liquid medium.

2. Description of the Prior Art

Even if a medium is optically opaque, as long as the medium is acoustically transparent, inspection by acoustic imaging through the medium is possible just like inspection by x-ray. Ultrasonic imaging through optically opaque media is applicable to medical diagnoses, microscopes, non-destructive inspections, inspections of submarine conditions, studies of earthquakes, and the like.

Heretofore, a number of proposals have been made on ultrasonic transducers by using various converting means, such as acoustic phase plates, annular arrays, acoustic lenses, light-sound transducers, and the like. In fact, however, there is still a need for improvement in focusing acoustic waves for the ultrasonic imaging.

To meet such need, the inventor has proposed an apparatus comprising an interdigital electrode means disposed on the surface of a piezoelectric member, so as to radiate ultrasonic beams from the interdigital electrode means by applying an AC voltage to the electrode means while keeping the electrode means in contact with a liquid. In this case, the thickness of the piezoelectric member is sufficient for exciting a surface wave (Rayleigh wave).

The aforesaid technique, however, has a shortcoming in that, due to the fact that the delicate interdigital electrode vibrates while being in contact with the liquid, mechanical and chemical protection has to be provided for the electrode.

SUMMARY OF THE INVENTION

Therefore, an object of the present invention is to obviate the aforesaid shortcoming of the conventional technique, and the invention is characterized by using a piezoelectric member whose thickness is equivalent to or less than the wavelength of an acoustic wave in said piezoelectric member, so as to excite a Lamb wave rather than a Rayleigh wave.

BRIEF DESCRIPTION OF THE DRAWING

For a better understanding of the invention, reference is taken to the accompanying drawing, in which.

DESCRIPTION OF THE PREFERRED EMBODIMENT

Figure 1:
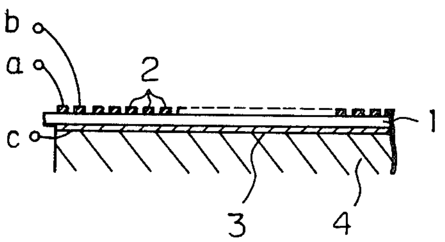
FIG. 1 is a schematic sectional view, showing the construction of an embodiment of the ultrasonic transducer according to the present invention.
Figure 2:
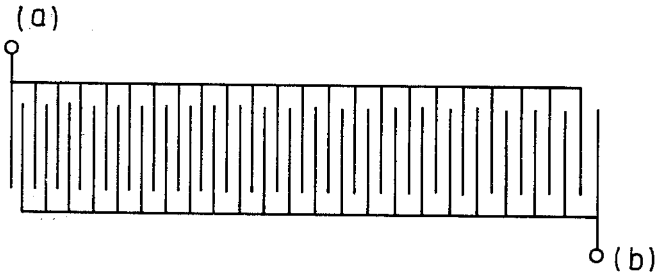
FIG. 2 is a schematic diagram showing the construction of interdigital electrodes 2.

Referring to FIG. 1 showing the construction of an embodiment of the ultrasonic transducer according to the present invention, 1 is a piezoelectric substrate whose thickness is equivalent to or less than the wavelength (λ) of an acoustic wave in the substrate. Interdigital electrodes 2 consist of two comb-like electrodes connected to terminals *a* and *b*, and electrode fingers of each comb-like electrode are disposed alternatingly in an interdigital fashion, as shown in FIG. 2. A planar electrode 3 connected to a terminal *c* is disposed at the rear surface of the substrate 1, and a liquid medium 4 is in contact with the planar electrode. With the ultrasonic transducer of the aforesaid construction, when three-phase alternating-current (AC) voltages are applied to the terminals *a, b,* and *c,* respectively, an acoustic wave, i.e., a longitudinal wave, given by the following equation (1) is radiated from the liquid medium side surface of the piezoelectric substrate, so as to radiate the acoustic wave into the liquid medium.

$$\sin\theta = V_W/V_L \quad \ldots (1)$$

Here, $\theta$ is the direction of radiating the acoustic wave, $V_W$ is the velocity of the acoustic wave in the liquid medium, and $V_L$ is the velocity of a Lamb wave propagating on the piezoelectric substrate.

The Lamb wave is different from the Rayleigh wave in that the Lamb wave is accompanied with displacements on the opposite surfaces of a medium through which the wave propagates, and in the case of symmetrical mode, the characteristics of such displacements are the same. Thus, if such characteristics are considered, the state of displacement on the substrate surface having the interdigital electrodes is the same as that on the opposite surface of the substrate, and hence, effective radiation of the acoustic wave into the liquid medium can be effected by disposing the substrate surface having the interdigital electrodes away from the liquid medium while placing the opposite surface (i.e., the surface having the planar electrode) in contact with the liquidal medium. Besides, an acoustic wave arriving at a transducer of the aforesaid type can be effectively converted into electric signals, and in this case, the sensitivity also becomes maximum for the acoustic wave from the direction satisfying the aforesaid equation (1).

When the period of the interdigital electrode to be disposed on the piezoelectric substrate is of uniform intervals, the acoustic wave radiated from each section of the interdigital electrode is radiated in an acoustic wave beam in parallel with a direction satisfying the following equation (2) which is related to the equation (1).

$$\theta = \sin^{-1}(V_W/f \cdot d) \quad \ldots (2)$$

Here, $f$ is the carrier frequency of electric signals applied to the transducer, and $d$ is the electrode period of the interdigital electrode.

It is noted here that, with the transducer construction explained above, if the planar electrode is dispensed with and single-phase AC voltages are applied to the interdigital electrodes, similar functions of the transducer can be maintained. If the voltages applied are of single-phase, two acoustic beams are radiated, one in $+\theta$ direction and the other in $-\theta$ direction, while if the voltages applied are of three-phase, only one wave is radiated in either $+\theta$ or $-\theta$ direction.

Furthermore, even when three-phase AC voltages are applied, it is noted that, with the present invention, the interdigital electrodes of the construction as shown in FIG. 2 are sufficient, and there is no need for providing three-phase electrodes on one side surface of the piezoelectric substrate as required by prior art (further requiring a special construction of a crossing portion of electrode leads in order to prevent short circuit). Accordingly, the electrode construction is greatly simplified in the present invention.

As regards the interdigital electrodes, an embodiment of linear construction is illustrated in the drawing, but it is needless to say that interdigital electrodes of arcuate shape can be also used for maintaining the similar function.

Figure 3:
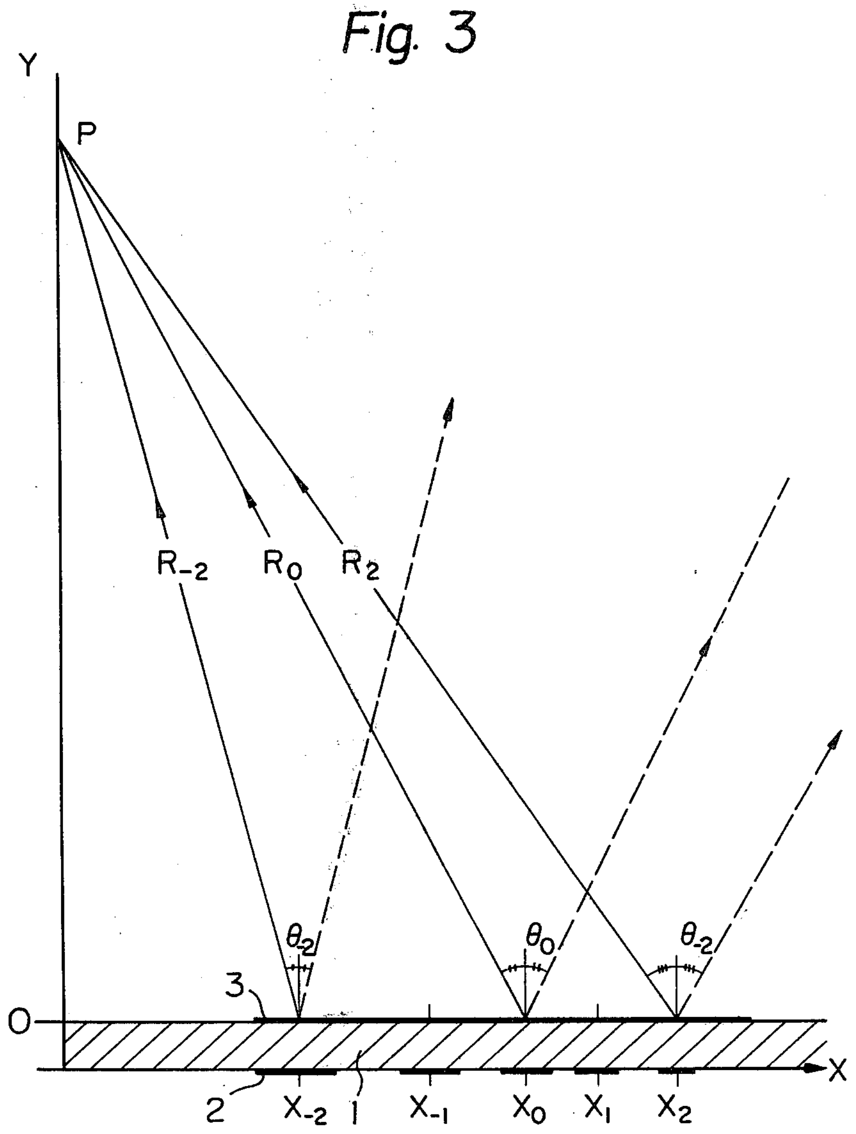
FIG. 3 is an explanatory diagram of the operating principles of the present invention.

The spacing between electrodes will now be described by referring to FIG. 3. The relation between the wavelength $\lambda_f$ of an acoustic wave of frequency $f$ in a liquid and the direction of the maximum beam output (angle $\theta$) is determined by the following equation, which equation is in good agreement with the results of the inventor's experiments.

$$\sin\theta = \lambda_f / 2d \text{ tm} \ldots (3)$$

Here, d is a spacing between electrodes. Thus, referring to FIG. 3, in order to focus the acoustic waves radiated by different electrodes at a point P (i.e., to satisfy the conditions for the acoustic waves radiated at different points to pass the point P and to be in phase with each other), the requirement of the following equation must be fulfilled.

$$X_n = (R_0^2 \sin^2\theta_0 + n\lambda_f R_0 + \tfrac{1}{4} n^2 \lambda_f^2)^{\frac{1}{2}} \quad (4)$$
$$n = 0, \pm 1, \pm 2, \ldots, \pm N$$

Here, $\lambda_f$ is the wavelength of an acoustic wave of frequency f in the liquid, $R_o$ is the distance from zeroth electrode to the beam focusing point, and $X_n$ is the horizontal distance from the origin (0) to a specific electrode concerned.

As regards the material for the electrodes described in the foregoing, a combination of chromium CR and gold Au is, for instance, mechanically strong and satisfactory, and the electrodes are formed on the surface of the piezoelectric substrate by a known method, such as evaporation and sputtering. The piezoelectric substrate can be of $LiNbO_3$, quartz, $Bi_{12}GeO_{20}$, PZT-family ceramic (e.g., piezoelectric ceramic 91A manufactured by TDK Electronics Co., Ltd., or the like.

EXAMPLE 1

Figure 4:
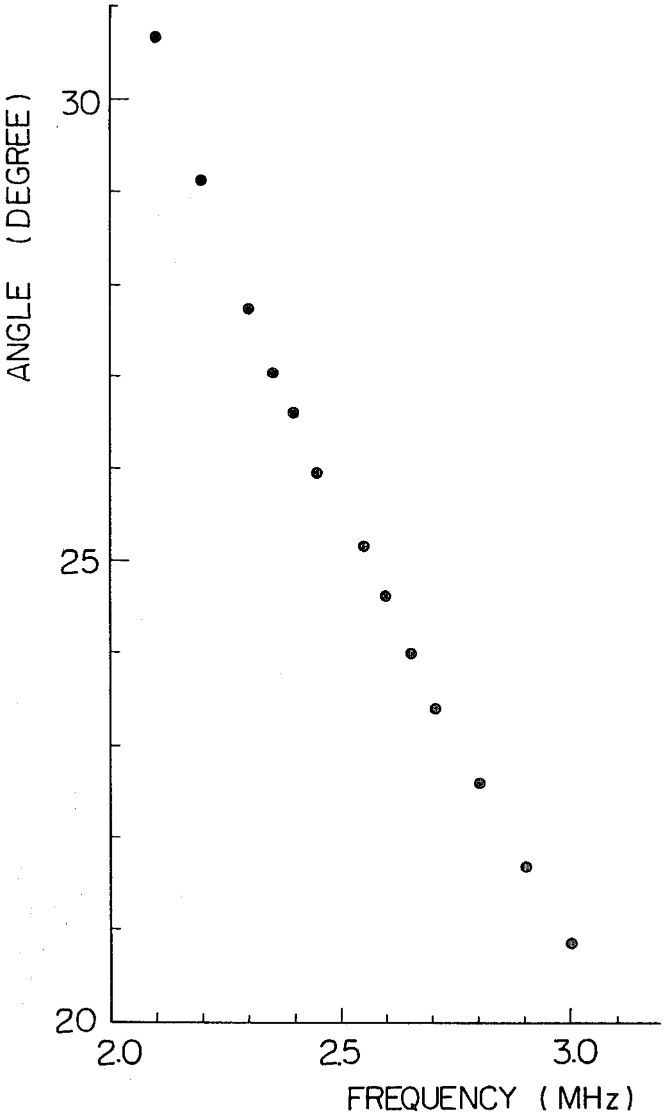
FIGS. 4 and 5 are graphs showing the exemplary results of experiments.

An ultrasonic transducer was made by preparing a piezoelectric substrate with a piezoelectric ceramic 91A made by TDK, mounting interdigital electrodes of uniform spacing (with an electrode period of 1.4 mm, an electrode overlap width of 10 mm, and electrode finger width of 350 μm which is identical with the electrode spacing) onto one surface of the substrate, forming a planar electrode on the opposite surface of the substrate through CR-Au sputtering and connecting the electrodes to terminals *a, b,* and *c,* as shown in FIGS. 1 and 2. Electric signals of high-frequency pulses were applied to the two electrode terminals *a* and *b* of the interdigital electrodes. When the carrier frequency of the electric signals was varied, the direction ($\theta$) of acoustic beams radiated from the back surface in contact with a liquid varied with the carrier frequency variation as shown in FIG. 4.

In this case, the polarizing axis was perpendicular to that plane of the piezoelectric ceramic which carried the interdigital electrodes, and the piezoelectric ceramic had a length of 70 mm, a width of 20 mm, and a thickness of 0.15 mm. Furthermore, similar performance characteristics were obtained both when a combination of one of the two terminals for the interdigital electrodes and the planar electrode (used as an earth or a ground electrode) on the opposite surface was used and when only the interdigital electrodes were used without forming any planar electrode. In the latter case, acoustic waves were radiated in two directions, i.e., $+\theta$ direction and $-\theta$ direction. The acoustic waves of the two directions may be positively used, but one of them may be eliminated by a sound absorbing treatment depending on the conditions.

EXAMPLE 2

Figure 5:
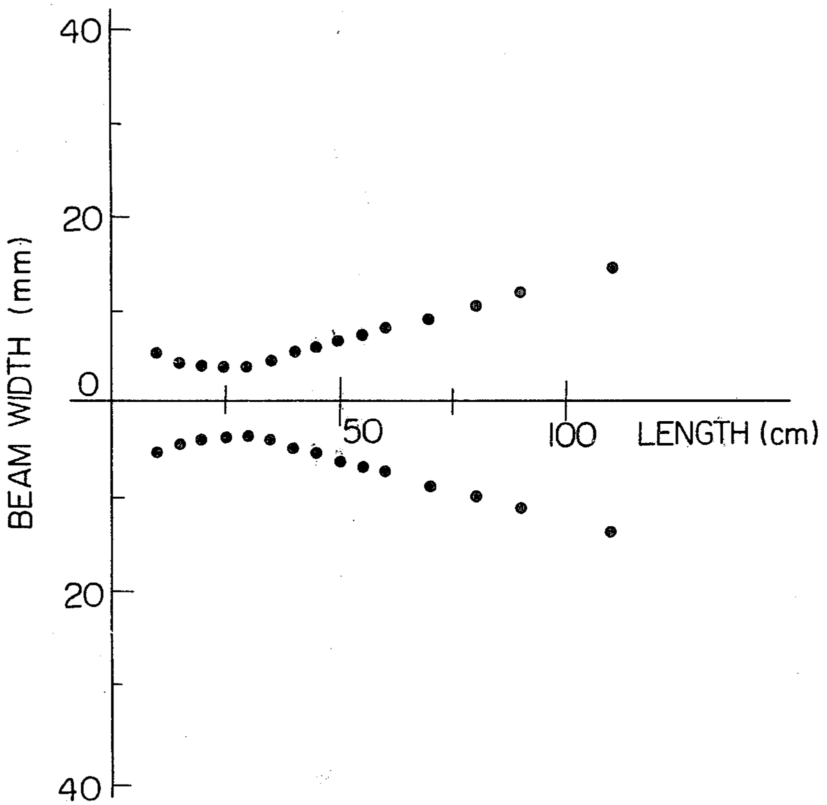

A device was fabricated by using a piezoelectric ceramic having the same characteristics as that of Example 1, which device was designed for focusing 2.3 MHz acoustic waves at a position 30 cm away from the transducer, and tests were made on the device. The graph of FIG. 5 shows the results of the tests, wherein the beam widths are for 3 dB-energy-down values relative to the center. It is apparent from the results that the beam width at the focused portion was 7.5 mm and the distance to the beam focused point was close to the designed value. The results were on the conditions that the planar electrode in contact with a liquid was used as a ground electrode and three-phase electric signals were applied to three sets of electrode terminals including two terminals for interdigital electrodes, and the radiation of the acoustic beams in only one direction was confirmed.

Similar beam focusing characteristics of acoustic waves was confirmed in the case of applying single-phase electric signals to two terminals of the three electrode terminals.

As described in detail in the foregoing, if AC voltages are applied to interdigital electrodes disposed on a thin piezoelectric substrate, ultrasonic wave beams with excellent focusing characteristics can be radiated into a liquid which is in contact with the substrate.

The application of the present invention is not restricted to imaging or picture taking, but the invention can be applied to general uses requiring the focusing of acoustic wave beams, for instance atomization of liquid by focusing wave beams at a boundary surface between the liquid and air.

Although the invention has been described with a certain degree of particularity, it is understood that the present disclosure has been made only by way of example and the numerous changes in details of construction and the combination and arrangement of parts may be resorted to without departing from the scope of the invention as hereinafter claimed.

What is claimed is

1. An ultrasonic transducer characterized by comprising a piezoelectric substrate whose thickness is substantially smaller than wavelength ($\lambda$) of an ultrasonic wave in said substrate and an interdigital electrode means disposed on one side surface of said substrate, so that as AC voltages are applied to said interdigital electrode means while keeping the opposite side surface of said substrate in contact with a liquid medium ultrasonic waves are radiated toward said liquid medium.

2. An ultrasonic transducer according to claim 1, wherein a planar electrode is disposed on the opposite surface of said substrate and three-phase AC voltages are applied across said interdigital electrode means and said planar electrode.

3. An ultrasonic transducer according to claim 1 or 2, wherein frequency f of AC voltages is determined depending on said radiating direction of ultrasonic waves.

4. An ultrasonic transducer according to claim 1 or 2, wherein spacing between individual electrode fingers of said interdigital electrode means satisfy relations of $$X_n = (R_0{}^2 \sin^2\theta_0 + n\lambda_f R_0 + \tfrac{1}{4}\, n^2 2_f{}^2)^{\frac{1}{2}}$$
$$n = 0, \pm 1, \pm 2, \ldots, \pm N$$

here, $\lambda_f$ is the wavelength of an acoustic wave of frequency f in said liquid medium, $R_o$ is the distance from zeroth electrode to a beam focusing point, and $\theta_o$ is the direction of a beam from the zeroth electrode.

5. An ultrasonic transducer for generating ultrasonic waves in a liquid medium, comprising:

a piezoelectric substrate whose thickness is substantially smaller than the wavelength (λ) of an ultrasonic wave in said substrate; and interdigital electrode means disposed on one side surface of said substrate for generating a Lamb wave radiating from the opposite side surface of said substrate, so that as AC voltages are applied to said interdigital electrode means while the opposite side surface of said substrate is maintained in contact with a liquid medium, ultrasonic waves are radiated toward said liquid medium.

6. The ultrasonic transducer according to claim 5, additionally including in combination a liquid medium in contact solely with said opposite side surface of said substrate.

* * * * *